United States Patent [19]

Nakashiba

[11] Patent Number: 5,747,788

[45] Date of Patent: May 5, 1998

[54] SOLID STATE IMAGE SENSOR WITH REINFORCED FRINGE ELECTRIC FIELD AT ITS CHARGE TRANSFER SECTION

[75] Inventor: Yasutaka Nakashiba, Tokyo, Japan

[73] Assignee: NEC Corporation, Tokyo, Japan

[21] Appl. No.: 624,968

[22] Filed: Mar. 29, 1996

[30] Foreign Application Priority Data

Mar. 31, 1995 [JP] Japan ................... 7-075061

[51] Int. Cl.⁶ ............................. H01L 27/00; H04N 3/14
[52] U.S. Cl. ..................... 250/208.1; 348/311; 348/320
[58] Field of Search .................. 250/208.1; 358/482, 358/483; 348/311, 314, 320; 257/231, 232, 233

[56] References Cited

U.S. PATENT DOCUMENTS

| | | | |
|---|---|---|---|
| 4,987,466 | 1/1991 | Shibata et al. | 257/231 |
| 5,060,038 | 10/1991 | Kimata et al. | 257/232 |
| 5,194,724 | 3/1993 | Sekine | 250/208.1 |
| 5,243,180 | 9/1993 | Nam | 348/320 |
| 5,521,405 | 5/1996 | Nakashiba | 257/231 |

OTHER PUBLICATIONS

Television Association Journal, vol. 37, No. 10, 1983, pp. 782–787.

Primary Examiner—Edward P. Westin
Assistant Examiner—Kevin Pyo
Attorney, Agent, or Firm—Sughrue, Mion, Zinn, Macpeak & Seas, PLLC

[57] ABSTRACT

The solid state image sensor disclosed includes a photoelectric conversion section, a vertical charge transfer section, a horizontal charge transfer section and an output section. The horizontal charge transfer section has an electric field reinforcing region in which a depletion layer is extended in a depth direction thereby reinforcing a fringe electric field. The vertical charge transfer section and the horizontal charge transfer section are disposed in a first semiconductor layer and a second semiconductor layer which are joined together, and the electric field reinforcing region is provided in a region in which the second semiconductor layer is not present. Thus, the transfer efficiency of the signal charge in the horizontal charge transfer section is enhanced.

5 Claims, 7 Drawing Sheets

SOLID STATE IMAGE SENSOR WITH REINFORCED FRINGE ELECTRIC FIELD AT ITS CHARGE TRANSFER SECTION

BACKGROUND OF THE INVENTION

(1) Field of the Invention

The present invention relates to a solid state image sensor, and more particularly to a structure of a charge transfer section of the solid state image sensor.

(2) Description of the Related Art

As compared with an image pickup tube which has generally been used, a solid state image sensor is superior in the aspects such as compactness, lighter weight, longer durability, low residual image, and better photo-finishing. Thus, in the field of consumer movie cameras with small sizes, the utilization of the solid state image sensor has exceeded that of the image pickup tube and, also in the field of industrial cameras with comparatively large image sizes, the solid state image sensor is about to take over the image pickup tube.

In order to assist the understanding of the invention, a prior art solid state image sensor of the kind to which the present invention relates is first explained with reference to FIG. 1 which illustrates a system called an interline transfer system. As shown therein, the conventional solid state image sensor comprises a plurality of columns of vertical charge transfer sections 802, photoelectric conversion sections 801, a horizontal charge transfer section 803, and an output section 804. Numeral 805 depicts a vertical/horizontal connection section and 806 depicts an element isolation section. Each of the photoelectric conversion sections 801 is disposed adjacent to one side of each long side of columns of the vertical charge transfer sections 802 such that the signal charge is read by the vertical charge transfer sections 802. The horizontal charge transfer section 803 is electrically coupled to an end of each of the vertical transfer sections 802 and transfers the signal charge read by the vertical charge transfer sections 802 to the output section 804. The output section 804 outputs to the outside the signal charge transferred from the horizontal charge transfer section 803.

The solid state image sensor described above with reference to FIG. 1 operates such that the signal charges are stored at a group of the photoelectric conversion sections 801 in accordance with the quantity of incident light, and the stored signal charges are read by the vertical charge transfer sections 802 correspondingly with the individual frame cycles or the individual field cycles of the image signals. Thereafter, the signal charges thus read are sequentially transferred downwardly in parallel within the vertical charge transfer sections 802 for individual horizontal operational cycles of the image signals. The signal charges transferred to terminal portions of the group of the vertical charge transfer sections 802 are transferred in parallel to the horizontal charge transfer section 803 on individual horizontal scanning cycle bases. The signal charges transferred to the horizontal charge transfer section 803 are sequentially transferred in a horizontal direction during the time in which the signal charges are transferred at the next cycle from the group of the vertical charge transfer sections 802, and the transferred signal charges are discharged as image signals to the outside from the output section 804.

A cell section of the sensor is shown in FIG. 2 in a sectional view taken along line 2—2 of FIG. 1, a charge transfer section thereof is shown in FIG. 3A in a sectional view taken along line 3A—3A of FIG. 1, and a potential graph is shown in FIG. 3B.

In FIGS. 2 and 3A, the numeral 901 depicts an N-type semiconductor substrate; 902 depicts a first P-type well layer constituting a buried channel for the horizontal charge transfer section 803 and the vertical charge transfer section 802 shown in FIG. 1; 903 depicts an N-type semiconductor region constituting a buried channel for the horizontal charge transfer section 803 and the vertical charge transfer section 802 shown in FIG. 1; 904 depicts a second P-type well layer having a vertical type over-flow drain configuration for suppressing a blooming phenomenon by removing to the N-type semiconductor substrate 901 the excess charges caused by intense incident light, and constituting a buried channel for the photoelectric conversion section 801, the horizontal charge transfer section 803 and the vertical charge transfer section 802 shown in FIG. 1; 905 depicts an N-type semiconductor region constituting the photoelectric conversion section 801 shown in FIG. 1; 906 depicts a $P^+$-type semiconductor region constituting the photoelectric conversion section 801 shown in FIG. 1; 907 depicts a $P^+$-type semiconductor region as an element isolation section; 908 depicts a conductive electrode; 909 depicts a silicon oxide film; 910 depicts a shielding metal film; and 911 depicts a protective silicon oxide film (refer to *Television Association Journal* Vol. 37, No. 10 (1983)).

In the prior art solid state image sensor described above, it is difficult to attain self-alignment in the formation of the first P-type well layer 902 constituting the horizontal charge transfer section 803 and the vertical charge transfer section 802 and the second P-type well layer 904 constituting the photoelectric conversion section 801 shown in FIG. 1 so that, by utilizing a difference between the impurity concentration of the first P-type well layer 902 and that of the second P-type well layer 904, an impurity having a different concentration from the second P-type well layer 904 is implanted to a portion of the second P-type well layer 904 thereby forming the first P-type well layer 902 in the portion of the second P-type well layer 904.

In the above prior art solid state image sensor, the horizontal charge transfer section 803 and the vertical charge transfer section 802 are constituted by the same structures of the first P-type well layer 902, the N-type semiconductor region 903 and the second P-type well layer 904. Thus, where the picture elements have increased resulting in the narrowing of the channel width of the vertical charge transfer section 802, the lowering of the capacity for the charge transfer at the vertical charge transfer section 802 is prevented by making shallower the junction depth between the first P-type well layer 902 constituting the horizontal charge transfer section 803 and the vertical charge transfer section 802 and the N-type semiconductor region 903. In this way, however, the depth of the junction between the first P-type well layer 902 at the horizontal charge transfer section 803 having the same configuration as that of the vertical charge transfer section 802 and the N-type semiconductor region 903 also becomes shallower. This leads to a problem that, despite the need for speeding up the charge transfer necessitated by an increase in the picture elements, the efficiency of transferring, especially minute signal charges, is deteriorated.

SUMMARY OF THE INVENTION

An object of the invention, therefore, is to overcome the problems existing in the prior art, and to provide a solid state image sensor in which the transfer efficiency of the signal charge in the charge transfer section is enhanced.

According to one aspect of the invention, there is provided a solid state image sensor comprising:

a photoelectric conversion section for accumulating a signal charge in accordance with quantity of incident light;

a vertical charge transfer section which reads the signal charge from the photoelectric conversion section;

a horizontal charge transfer section to which the signal charge is inputted from the vertical charge transfer section; and an output section which outputs the signal charge transferred from the horizontal charge transfer section, at least one of the vertical charge transfer section and the horizontal charge transfer section having an electric field reinforcing region in which a depletion layer is extended in a depth-wise direction thereby reinforcing a fringe electric field.

The solid state image sensor according to the invention is configured such that, by utilizing an impurity concentration difference between the first P-type well layer constituting the horizontal transfer section and the vertical charge transfer section and the second P-type well layer constituting the photoelectric conversion section, the first P-type well layer is formed in a portion of the second P-type well layer. Also, the structure includes a region which allows, in at least one of the horizontal charge transfer section and the vertical charge transfer section, a depletion layer to extend in a depth-wise direction go as to reinforce a fringe electric field. This electric field reinforcing region enables the enhancement of the transfer efficiency of the signal charge.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1:
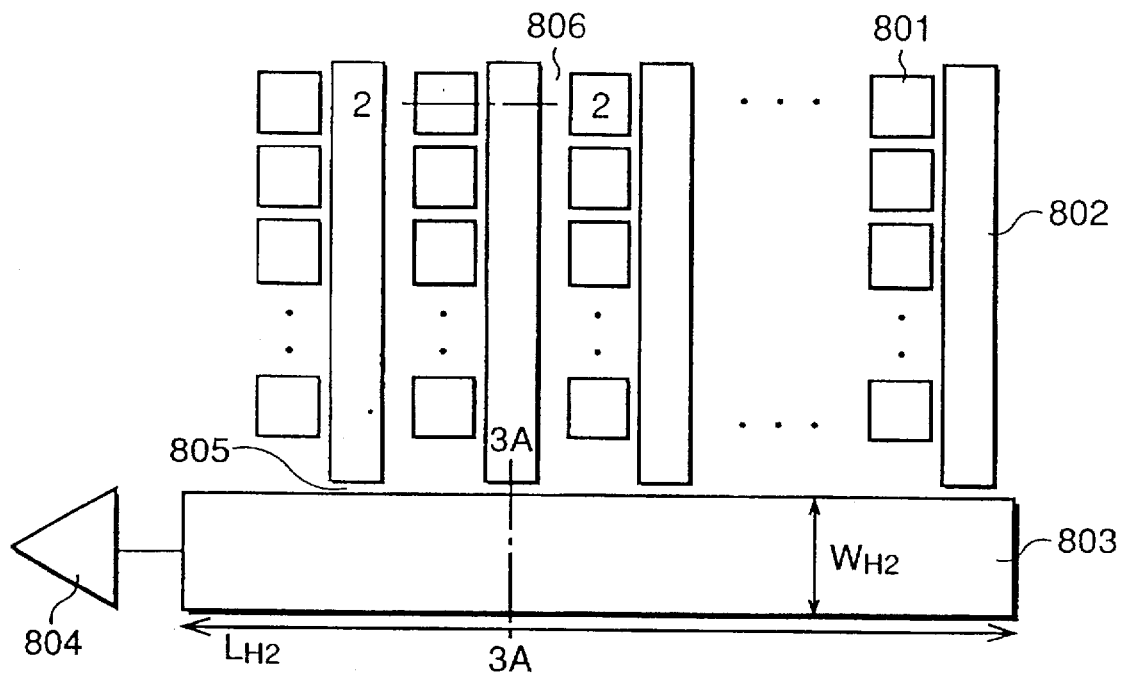
FIG. 1 is a plan view showing a conventional solid state image sensor.
Figure 2:
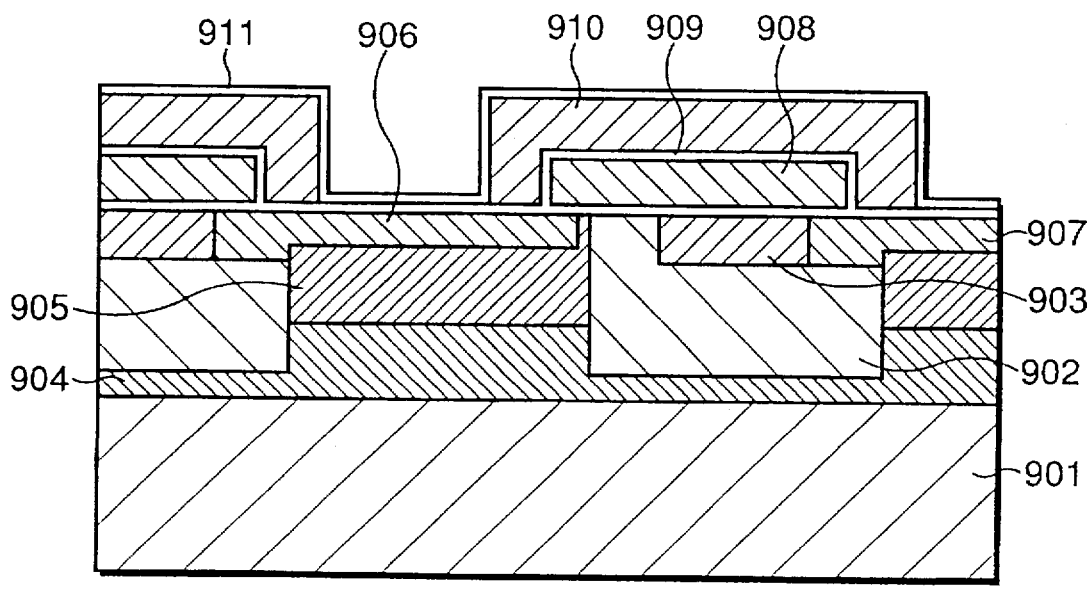
FIG. 2 is a sectional view of a cell section of the conventional solid state image sensor.
Figure 3A:
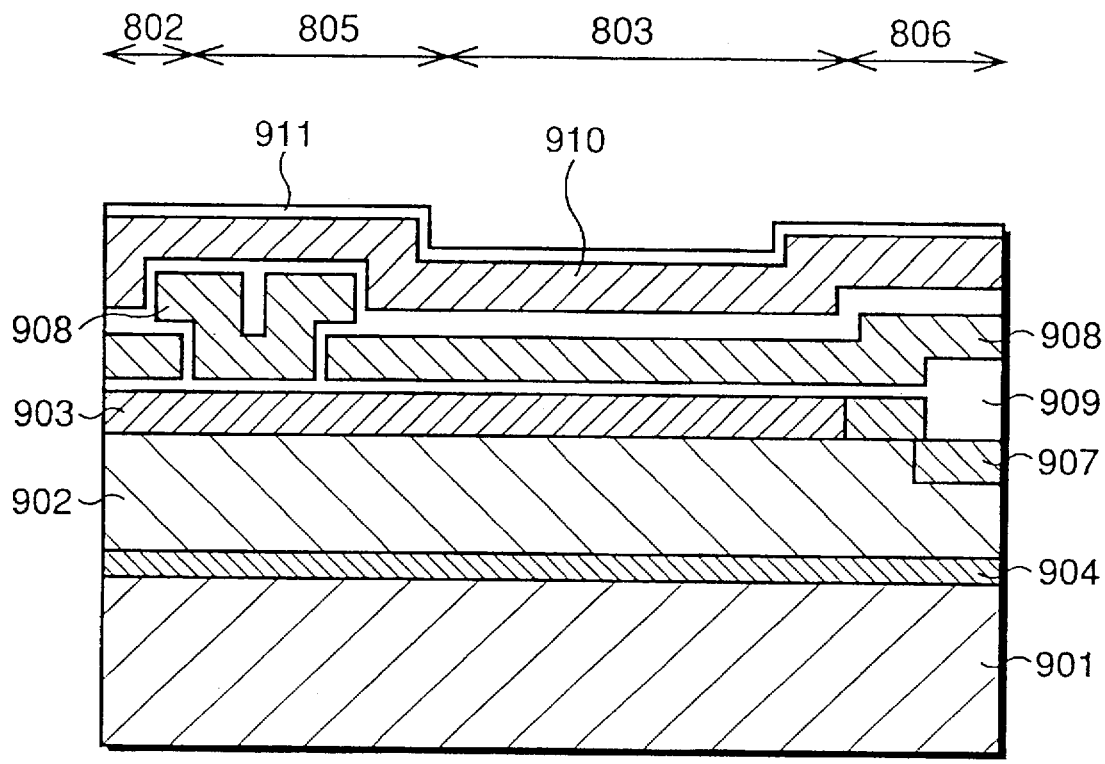
FIG. 3A is a sectional view of a charge transfer section of the conventional solid state image sensor.
Figure 3B:
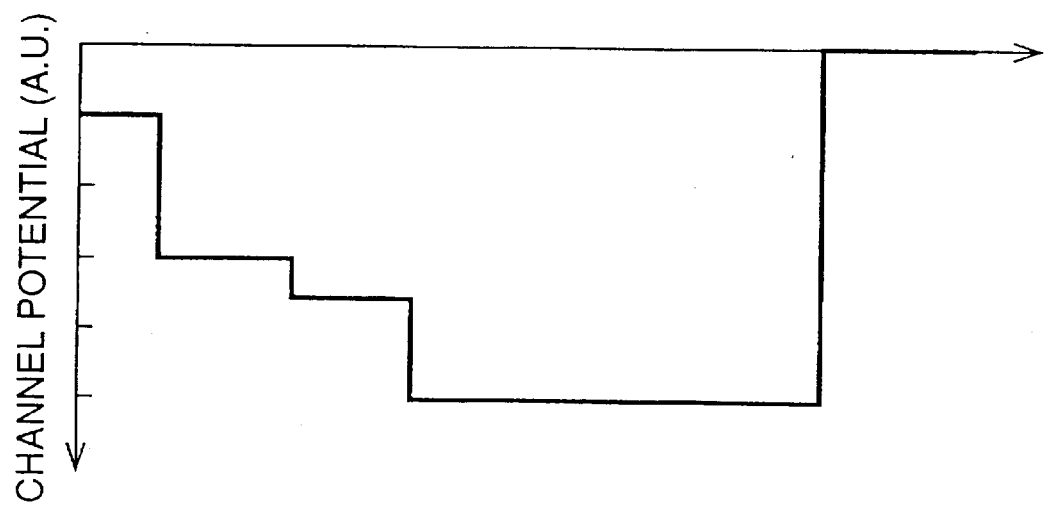
FIG. 3B is a graph showing potentials at the charge transfer section.
Figure 4:
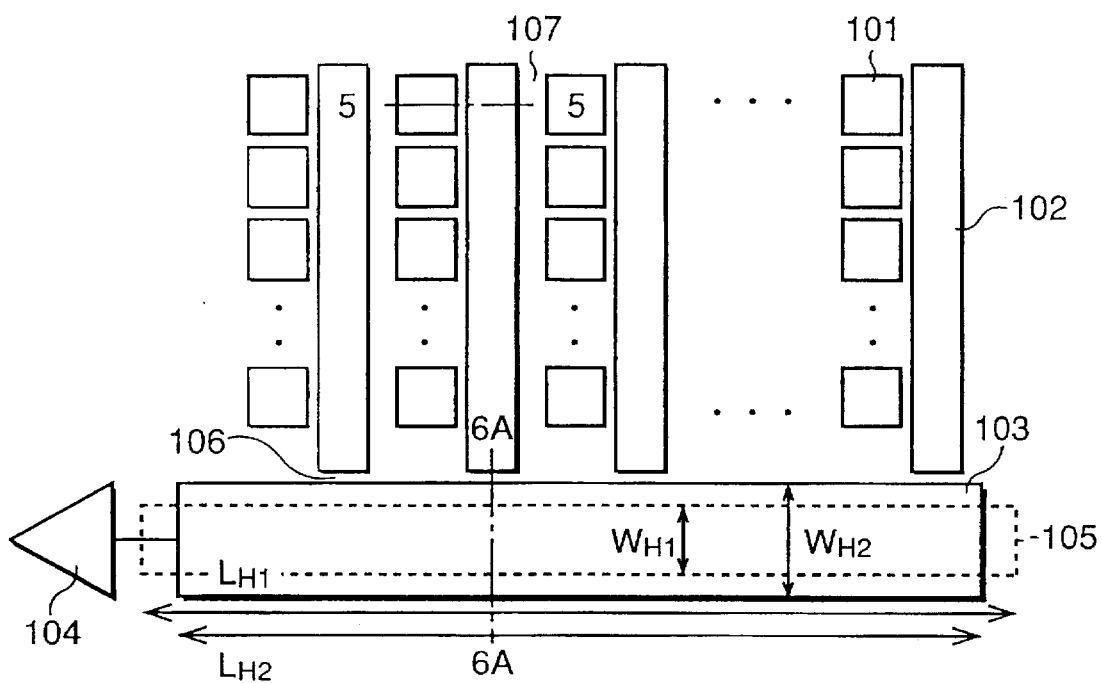
FIG. 4 is a plan view showing a solid state image sensor of a first embodiment according to the invention.
Figure 5:
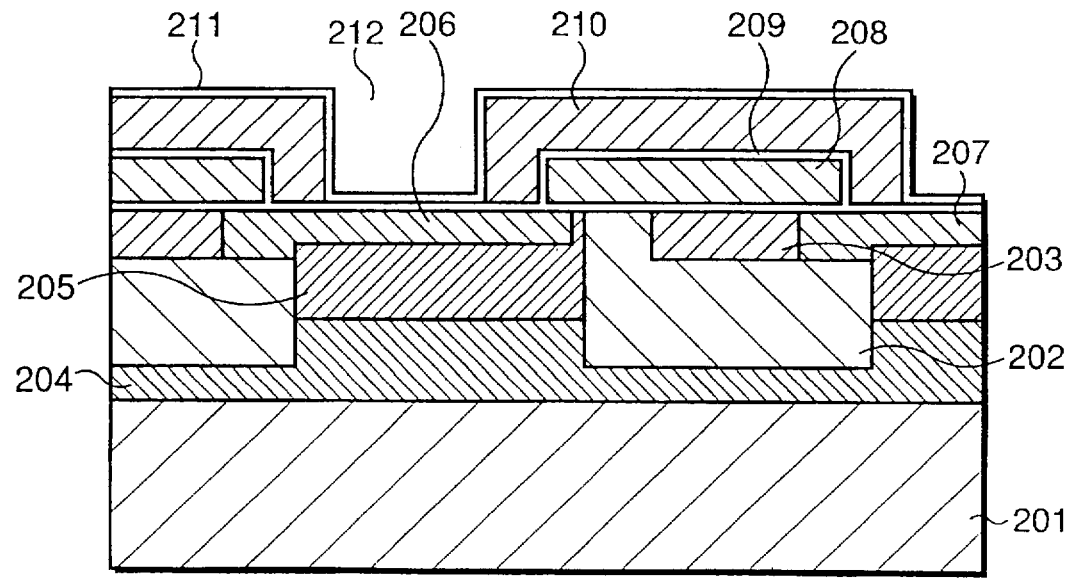
FIG. 5 is a sectional view of a cell section of the solid state image sensor of the first embodiment according to the invention.
Figure 6A:
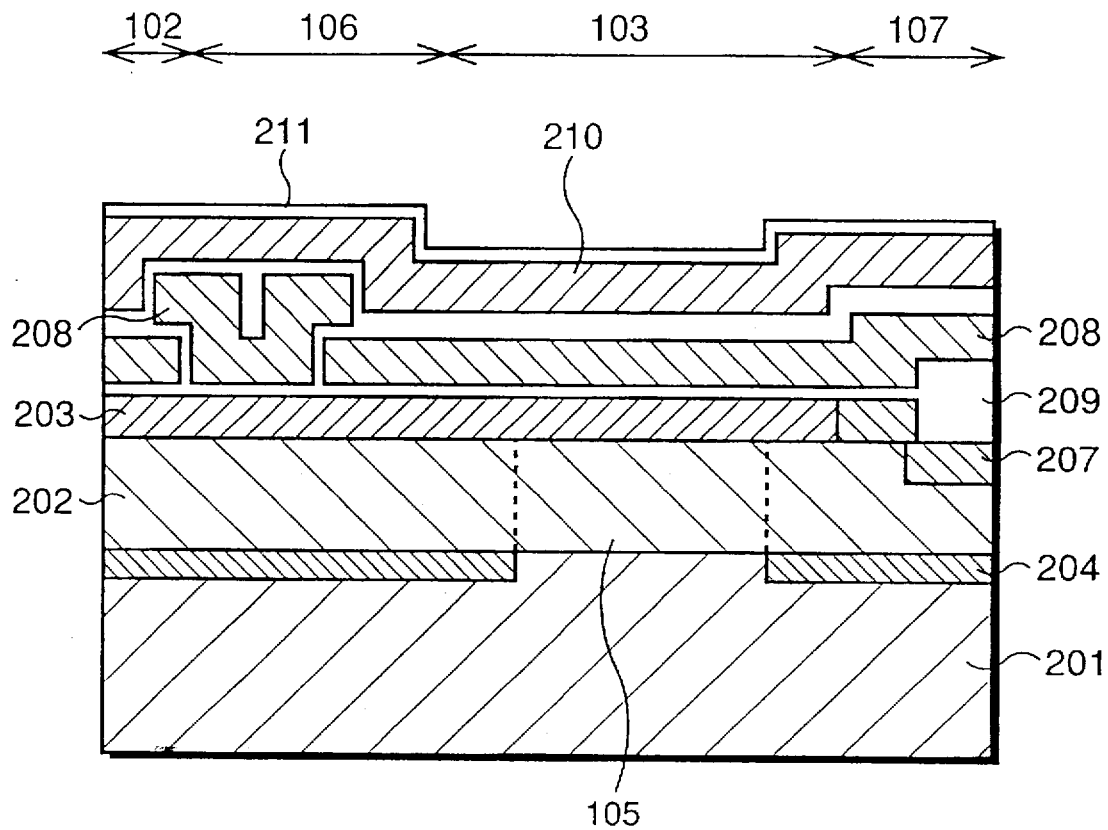
FIG. 6A is a sectional view of a charge transfer section of the solid state image sensor of the first embodiment according to the invention.
Figure 6B:
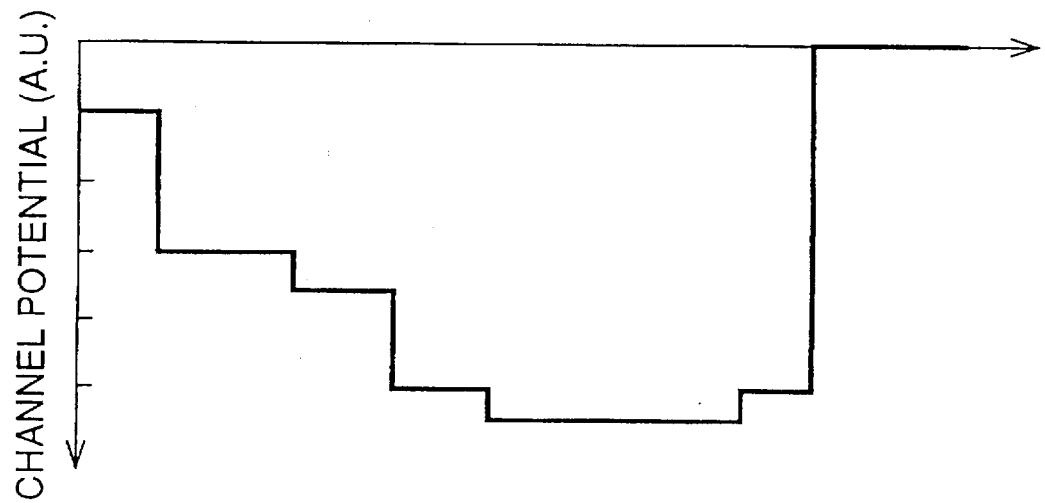
FIG. 6B is a graph showing potentials at the charge transfer section.

FIG. 4 shows, in a plan view, a solid state image sensor of a first embodiment according to the invention, FIG. 5 shows the same in a sectional view taken along line 5—5 of FIG. 4, and FIG. 6A shows the same in a sectional view taken along line 6A—6A of FIG. 4.

As shown, the basic arrangement of the solid state image sensor according to the invention includes a photoelectric conversion section 101, a vertical charge transfer section 102, a horizontal charge transfer section 103, and an output section 104. Numeral 106 depicts a vertical/horizontal connection section and 107 depicts an element isolation section. The photoelectric conversion section 101 stores signal charges corresponding to the quantity of the incident light, the vertical charge transfer section 102 reads the signal charges in the photoelectric conversion section 101 and transfers them to the horizontal charge transfer section 103, and the horizontal transfer section 103 transfers to the output section 104 the signal charge received from the vertical charge transfer section 102. The output section 104 outputs to the outside the signal charge received from the horizontal charge transfer section 103, and at least one of the vertical charge transfer section 102 and the horizontal charge transfer section 103 has an electric field reinforcing region 105 which allows a depletion layer to extend in a depth-wise direction and reinforces a fringe electric field.

The vertical charge transfer section 102 and the horizontal charge transfer section 103 are formed in the semiconductor layers 202, 203 and 204 which are stacked together, and the electric field reinforcing region 105 is formed in a region in which a portion of the second semiconductor layer 204 is not formed with the first semiconductor layers 202 and 203 left in place.

The specific example of the solid state image sensor of this first embodiment is explained with reference to FIGS. 4 and 6A. Here, the second P-type well layer (semiconductor layer) 204 and the first P-type well layer (semiconductor layer) 202 are formed on an N-type semiconductor substrate 201. Since it is difficult to have the first P-type well layer 202 and the second P-type well layer 204 self-aligned, an impurity difference between the first P-type well layer 202 and the second P-type well layer 204 is used, and the first P-type well layer 202 is formed in a portion of the second P-type well layer 204.

As shown in FIG. 5, the N-type semiconductor region 203 is formed on the first P-type well layer 202, and the N-type semiconductor region 205 is formed between adjacent first P-type well layers 202 on the second P-type well layer 204. Also, a P$^+$-type semiconductor region 206 is formed extending onto both the first P-type well layer 202 and the N-type semiconductor region 205. The numeral 207 depicts a P$^+$-type semiconductor region for element isolation, 208 depicts a conductive electrode, 209 depicts a silicon oxide film, 210 depicts a shielding metal film, and 211 depicts a protective silicon oxide film.

As shown in FIG. 5, the photoelectric conversion section 101 is constituted by the second P-type well layer 204, the N-type semiconductor region 205, and the P$^+$-type semiconductor region 206 which form a layered structure not covered by the metal film 210. The photoelectric conversion section 101 is in a vertical over-flow drain configuration which, by removing to the N-type semiconductor substrate 201 the excess charge generated by intense incident light, suppresses the blooming phenomena.

As shown in FIGS. 5 and 6A, the buried channel of the horizontal charge transfer section 103 and the vertical charge transfer section 102 is constituted by the first P-type well layer 202, the N-type semiconductor region 203 and the second P-type well layer 204. Also, as shown in FIG. 6A, the horizontal charge transfer section 103 and the vertical charge transfer section 102 are electrically connected with each other through the vertical/horizontal connection section 106.

In the first embodiment according to the invention, as shown in FIGS. 4–6A, there is provided an electric field reinforcing region 105 formed in a region in which the second P-type well layer 204 is not formed. The channel length $L_{H1}$ of the electric field reinforcing region 105 is larger than the channel length $L_{H2}$ of the horizontal charge transfer section 103 and the channel width $W_{H1}$ of the electrical field reinforcing region 105 is smaller than the channel width $W_{H2}$ of the horizontal charge transfer section 103. The electric field reinforcing region 105, configured as described above, reinforces the fringe electric field by extending the depletion layer formed in the horizontal charge transfer section 103 in a depth-wise direction thereof. Because of the reinforced fringe electric field, the speed with which the signal charges are transferred in the horizontal charge transfer section 103 is enhanced thereby improving the transfer efficiency of the signal charges.

In this first embodiment, the change is made only in the structure of the horizontal transfer section so that there is no change, as compared with the prior art example, in the characteristics of the vertical/horizontal connection section and the vertical charge transfer section.

Figure 7:
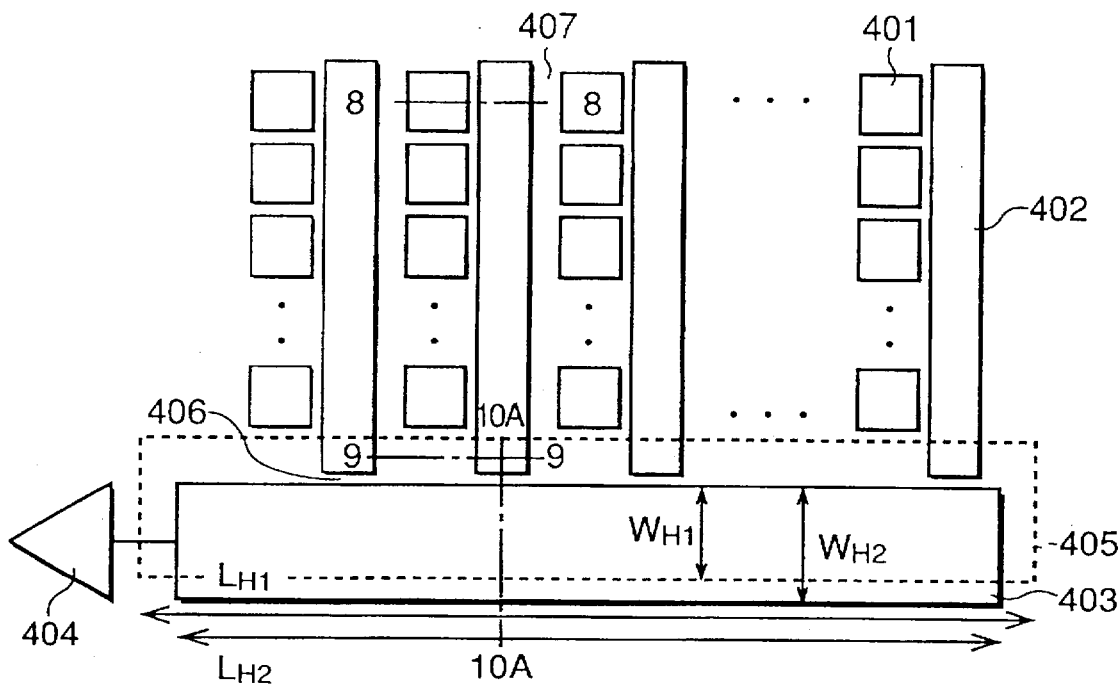
FIG. 7 is a plan view showing a solid state image sensor of a second embodiment according to the invention.

FIG. 7 is a conceptual diagram of a solid state image sensor of a second embodiment according to the invention. In FIG. 7, the numeral 401 depicts a photoelectric conversion section, 402 depicts a vertical charge transfer section, 403 depicts a horizontal charge transfer section, 404 depicts an output section, 406 depicts a vertical/horizontal connection section, and 407 depicts an element isolation section. A region shown in dotted lines is an electric field reinforcing region 405 formed in the region in which the second P-type well layer is not formed. The structures of these regions, namely, the photoelectric conversion section 401, the vertical charge transfer section 402, the horizontal charge transfer section 403, the output section 404 and the electric field reinforcing region 405, are the same as those shown in FIGS. 4–6A. However, as a feature distinguishing this embodiment over the first embodiment, the electric field reinforcing region 405 extends into an end portion of the vertical charge transfer section 402 which is disposed adjacent to the horizontal charge transfer section 403.

Figure 8:
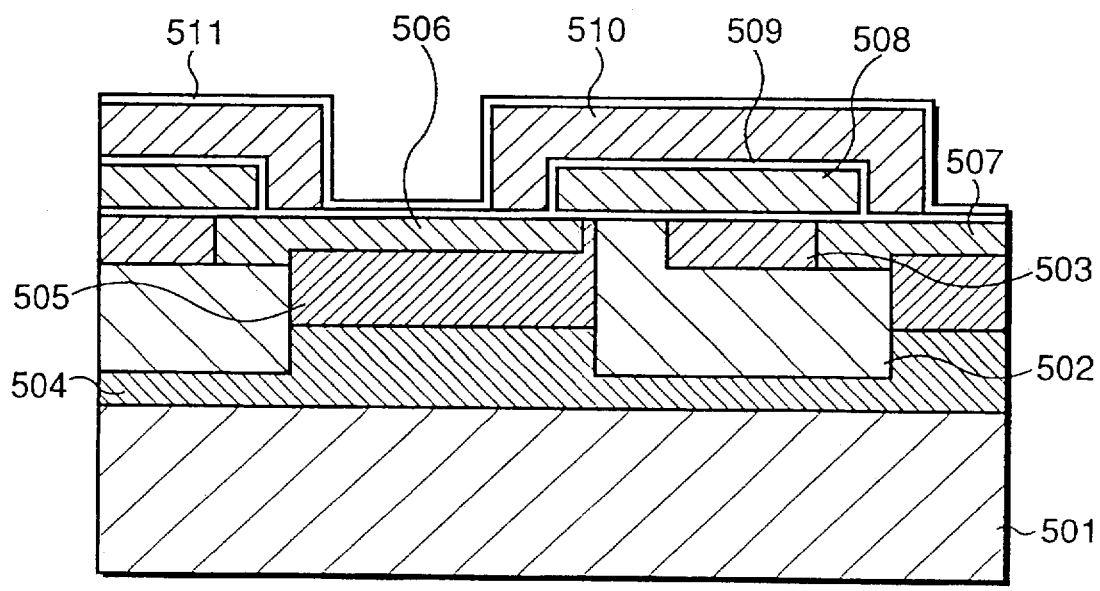
FIG. 8 is a sectional view of a cell section of the solid state image sensor of the second embodiment according to the invention.
Figure 9:
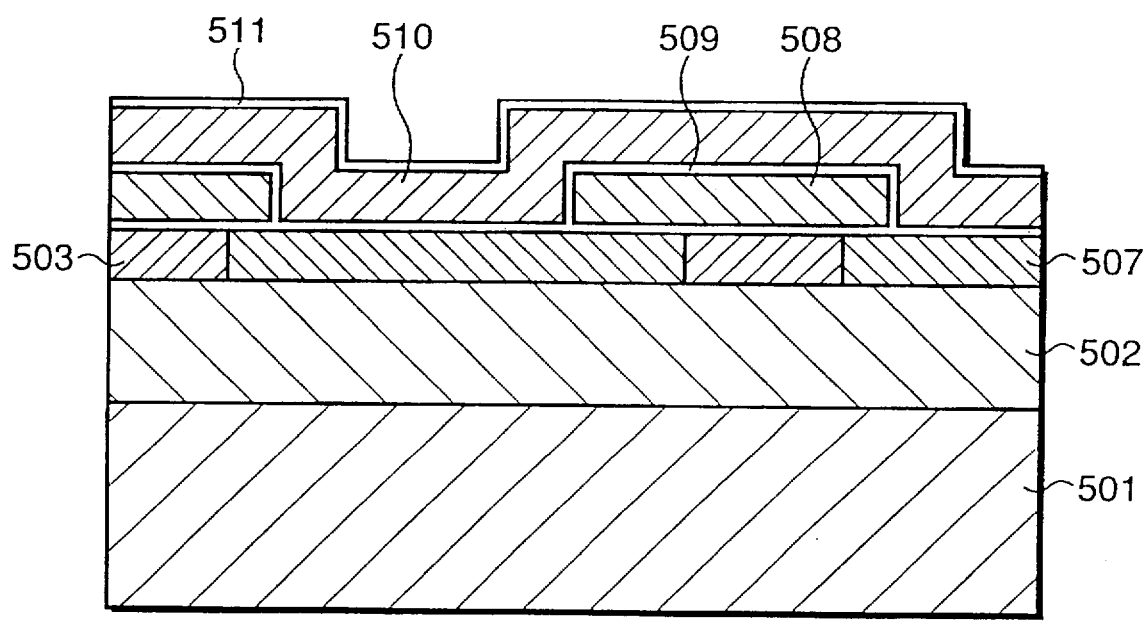
FIG. 9 is a sectional view showing another cell section in the second embodiment according to the invention.
Figure 10A:
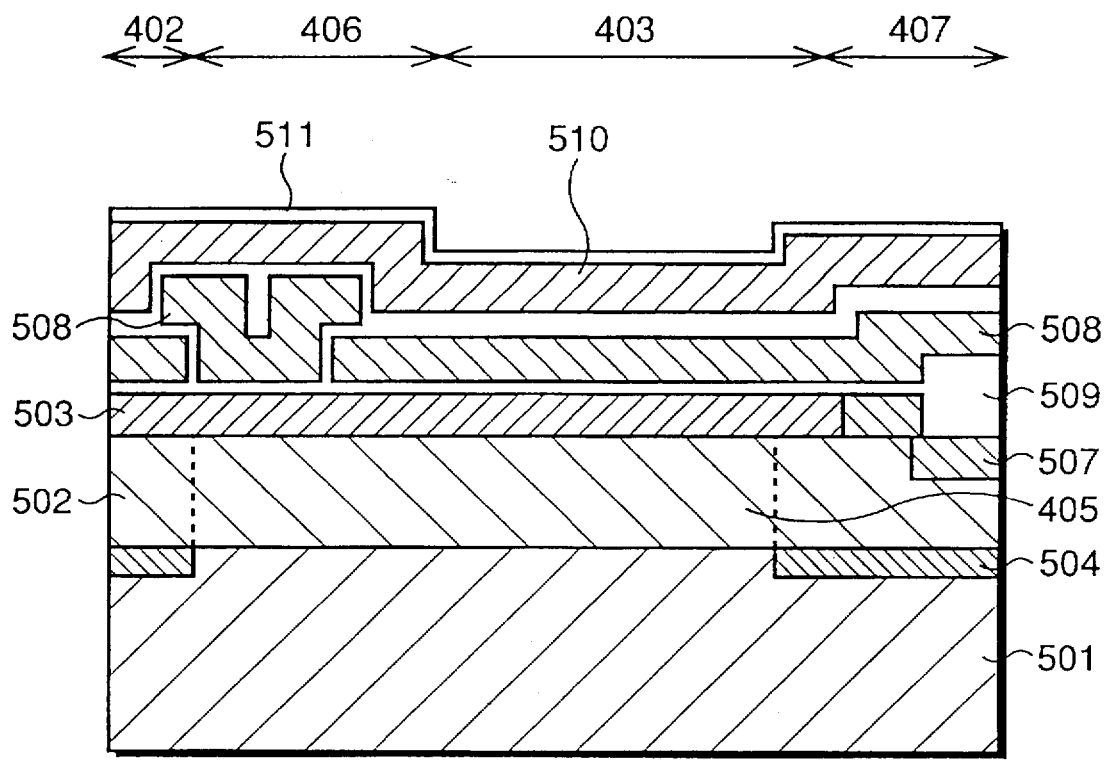
FIG. 10A is a sectional view showing a charge transfer section of the solid state image sensor of the second embodiment according to the invention.
Figure 10B:
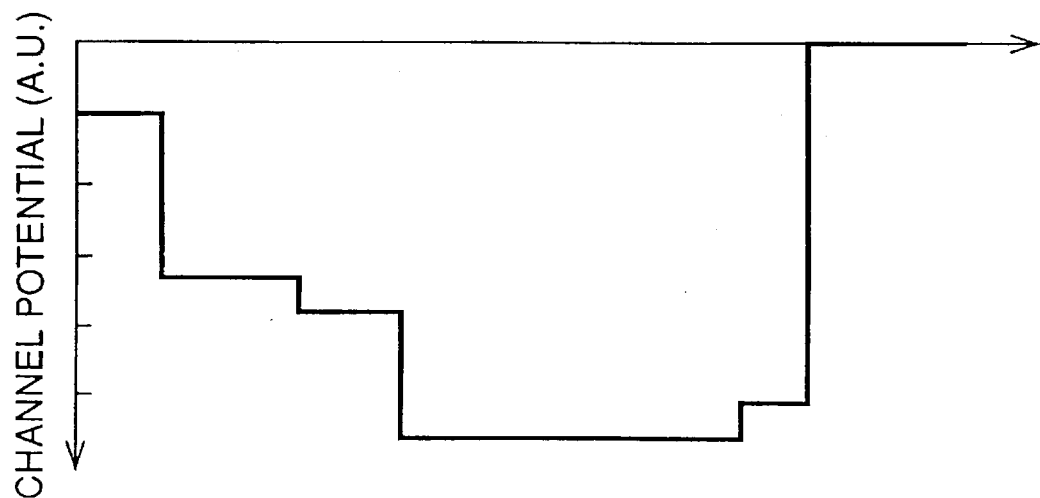
FIG. 10B is a graph showing potentials at the charge transfer section.

FIG. 8 shows the solid state image sensor of the second embodiment in a sectional view taken along line 8-8 of FIG. 7, FIG. 9 shows the same in a sectional view taken along line 9—9 of FIG. 7, and FIG. 10A shows the same in a sectional view taken along line 10A—10A of FIG. 7.

In FIGS. 8–10A, the numeral 501 depicts an N-type semiconductor substrate; 502 depicts a first P-type well layer constituting a buried channel for the horizontal charge transfer section 403 and the vertical charge transfer section 402; 503 depicts an N-type semiconductor region constituting a buried channel for the horizontal charge transfer section 403 and the vertical charge transfer section 402; 504 depicts a second P-type well layer having a vertical type over-flow drain structure for suppressing blooming phenomena by removing to the N-type semiconductor substrate 501 the excess charge generated due to intense incident light and constituting a buried channel for the photoelectric conversion section 401, a portion of the horizontal charge transfer section 403 and the vertical charge transfer section 402; 505 depicts an N-type semiconductor region constituting the photoelectric conversion section 401; 506 depicts a $P^+$-type region constituting the photoelectric conversion section 401; 507 depicts a $P^+$-type region as an element isolation section; 508 depicts a conductive electrode; 509 depicts a silicon oxide film; 510 depicts a shielding metal film; and 511 depicts a protective silicon oxide film.

In the solid state image sensor described above, since it is difficult to self-align the first P-type well layer 502 constituting the horizontal charge transfer section 403 and the vertical charge transfer section 402 and the second P-type well layer 504 constituting the photoelectric conversion section 401, the first P-type well layer 502 is formed at a portion of the second P-type well layer 504 by utilizing an impurity difference between the first P-type well layer 502 and the second P-type well layer 504.

In this second embodiment of the invention, as shown in FIGS. 7–10A, there is a region in which the second P-type well layer is not formed at an end portion of the vertical charge transfer section 402 disposed adjacent to the horizontal charge transfer section 403. The channel length $L_{H1}$ of the region is larger than the channel length $L_{H2}$ of the horizontal charge transfer section 403. Within this region, the electric field reinforcing region 405 is formed.

In the above arrangement, the depletion layer formed in the horizontal charge transfer section 403 and the horizontal/vertical connection section 406 extends deeper than in the prior art example which provides the sensor with the electric field reinforcing region 405. The electric field reinforcing region 405 increases the transfer speed of the signal charges in the horizontal charge transfer section 403. In addition the transfer speed of signal charges from the vertical charge transfer section 402 to the horizontal charge transfer section 403, is also increased. Therefore, the transfer efficiency of the signal charges is also increased.

In the second embodiment of the invention explained above, the differences between the structure of the embodiment and that of the prior art example can be found in the horizontal charge transfer section, the vertical charge transfer section and the horizontal/vertical connection section prior art example.

In the solid state image sensor described above, the first P-type well layer is formed in the second P-type well layer by utilizing a difference between the impurity concentration of the first P-type well layer and that of the second P-type well layer because it is difficult to attain the self-aligning in the formation of the first P-type well layer constituting the horizontal charge transfer section and the vertical charge transfer section and the second P-type well layer constituting the photoelectric conversion section. Also, as in the first embodiment explained above, the electric field reinforcing region is located in a region in which the second P-type well layer is not formed the channel length $L_{H1}$ of the region is larger than the channel length $L_{H2}$ of the horizontal charge transfer section and the channel width $W_{H1}$ of the region within the horizontal charge transfer section is smaller than the channel width $W_{H2}$ of the horizontal charge transfer section. This electric field reinforcing region enhances the speed with which the signal charge transfer section in the horizontal charges are transferred, thereby improving the transfer efficiency of the signal charges.

Further, as in the second embodiment explained above, the electric field reinforcing region may be provided at an end portion of the vertical charge transfer section disposed adjacent to the horizontal charge transfer section, with the extent of the region being such that the channel length $L_{H1}$ is larger than the channel length $L_{H2}$ of the horizontal charge transfer section. This increase the speed of the signal charge transfer in the horizontal charge transfer section and increase the speed of signal charges from the vertical charge transfer section to the horizontal charge transfer section so as to increase the transfer efficiency of the signal charges.

For example, where the concentration of the first P-type well is made $1\times10^{17}$ cm$^{-3}$, that of the second P-type well is made $1\times10^{16}$ cm$^{-3}$ and that of the N-type well is made $5\times10^{17}$ cm$^{-3}$, the transfer speed of the signal charge at the horizontal charge transfer section can be improved by 15% thus improving the transfer efficiency of the signal charges.

However, if the width $W_{H1}$ of the electric field reinforcing region in which the second P-type well layer of the horizontal charge transfer section is not formed is smaller than 4 μm, there is an influence due to the narrow channel effect. Although the performance of the electric field reinforcing region is far better than that in the prior art, the performance improvement becomes gradually smaller as the width $W_{H1}$ of the region without the second P-type well layer becomes smaller. Therefore, it is preferred that the width $W_{H1}$, at which the second P-type well layer is not formed, be within a range of 4 μm$\leq W_{H1} \leq W_{H2}$.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A solid state image sensor comprising:

a photoelectric conversion section for accumulating a signal charge in accordance with a quantity of incident light;

a vertical charge transfer section which reads said signal charge from said photoelectric conversion section;

a horizontal charge transfer section to which said signal charge is inputted from said vertical charge transfer section;

said vertical charge transfer section and said horizontal charge transfer section being disposed in a first semiconductor layer and a second semiconductor layer which are joined together; and an output section which outputs said signal charge transferred from said horizontal charge transfer section to an element external to said solid state image sensor;

at least one of said vertical charge transfer section and said horizontal charge transfer section having an electric field reinforcing region in which a depletion layer is extended in a depth-wise direction thereby reinforcing a fringe electric field, said electric field reinforcing region being provided at a region where said second semiconductor layer forms a well region.

2. A solid state image sensor according to claim 1, in which said electric field reinforcing region of said horizontal charge transfer section extends into end regions of said vertical charge transfer section adjacent to said horizontal charge transfer section.

3. A solid state image sensor according to claim 1, in which said electric field reinforcing region of said horizontal charge transfer section has a width not less than 4 μm.

4. A solid state image sensor according to claim 1, in which said electric field reinforcing region of said horizontal charge transfer section is provided within a range of area not larger than a channel width of said horizontal charge transfer section.

5. A solid state image sensor according to claim 1, in which said electric field reinforcing region of said horizontal charge transfer section is provided within a range of area not smaller than a channel length of said horizontal charge transfer section.

* * * * *